(12) United States Patent
Lo et al.

(10) Patent No.: US 12,328,959 B2
(45) Date of Patent: Jun. 10, 2025

(54) IMAGE SENSOR WITH IMPROVED TIMING RESOLUTION AND PHOTON DETECTION PROBABILITY

(71) Applicant: Taiwan Semiconductor Manufacturing Company, Ltd., Hsin-Chu (TW)

(72) Inventors: Wen-Shun Lo, Zhudong Township (TW); Felix Ying-Kit Tsui, Cupertino, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/366,122

(22) Filed: Aug. 7, 2023

(65) Prior Publication Data

US 2023/0378203 A1  Nov. 23, 2023

Related U.S. Application Data

(60) Continuation of application No. 17/324,345, filed on May 19, 2021, now Pat. No. 11,830,888, which is a
(Continued)

(51) Int. Cl.
H10F 39/00 (2025.01)
(52) U.S. Cl.
CPC ..... H10F 39/802 (2025.01); H10F 39/80377 (2025.01)
(58) Field of Classification Search
CPC ......... H01L 27/14603; H01L 27/14616; H10F 39/802; H10F 39/80377; H10F 39/014;
(Continued)

(56) References Cited

U.S. PATENT DOCUMENTS 6,049,118 A    4/2000  Nagano
9,728,667 B1   8/2017  Johnson et al.
(Continued)

OTHER PUBLICATIONS

Fong et al. "Timing Resolution and Time Walk in Super Low K Factor Single-Photon Avalanche Diode—Measurement and Optimization." Journal of Nanophotonics Jan-Mar. 2018, vol. 12(1). Published in 2018.
(Continued)

*Primary Examiner* — Shaun M Campbell
(74) *Attorney, Agent, or Firm* — Eschweiler & Potashnik, LLC (57) ABSTRACT

In some embodiments, a photodetector is provided. The photodetector includes a first well having a first doping type disposed in a semiconductor substrate. A second well having a second doping type opposite the first doping type is disposed in the semiconductor substrate on a side of the first well. A first doped buried region having the second doping type is disposed in the semiconductor substrate, where the first doped buried region extends laterally through the semiconductor substrate beneath the first well and the second well. A second doped buried region having the second doping type is disposed in the semiconductor substrate and vertically between the first doped buried region and the first well, where the second doped buried region contacts the first well such that a photodetector p-n junction exists along the second doped buried region and the first well.

20 Claims, 7 Drawing Sheets

Related U.S. Application Data division of application No. 16/408,859, filed on May 10, 2019, now Pat. No. 11,018,168.

(60) Provisional application No. 62/733,970, filed on Sep. 20, 2018.

(58) Field of Classification Search
CPC .. H10F 39/807; H10F 39/811; H10F 39/8037; H10F 39/8033
See application file for complete search history.

(56) References Cited

U.S. PATENT DOCUMENTS

| | | | |
|---|---|---|---|
| 9,978,802 | B2 | 5/2018 | Mazzillo et al. |
| 10,103,285 | B1 | 10/2018 | Lo et al. |
| 10,153,310 | B2 | 12/2018 | Zhang et al. |
| 10,845,308 | B2 * | 11/2020 | Rothberg ............... G01N 21/64 |
| 2005/0255625 | A1 | 11/2005 | Janesick et al. |
| 2009/0315135 | A1 | 12/2009 | Finkelstein et al. |
| 2010/0127314 | A1 | 5/2010 | Frach |
| 2010/0155867 | A1 | 6/2010 | Arai |
| 2010/0245809 | A1 | 9/2010 | Andreou et al. |
| 2010/0271524 | A1 * | 10/2010 | Venezia ............. H01L 27/1463  257/292 |
| 2012/0205731 | A1 | 8/2012 | Henderson et al. |
| 2013/0193546 | A1 | 8/2013 | Webster et al. |
| 2013/0320419 | A1 * | 12/2013 | JangJian ............... H01L 31/028  257/E31.127 |
| 2016/0218236 | A1 | 7/2016 | Dhulla et al. |
| 2018/0114809 | A1 * | 4/2018 | Kawahito ......... H01L 27/14623 |
| 2019/0081251 | A1 | 3/2019 | Obana et al. |
| 2021/0175264 | A1 * | 6/2021 | Kawahito ......... H01L 27/14627 |

OTHER PUBLICATIONS

Non-Final Office Action dated Sep. 21, 2020 for U.S. Appl. No. 16/408,859.

Notice of Allowance dated Jan. 22, 2021 for U.S. Appl. No. 16/408,859.

Non-Final Office Action dated Jan. 18, 2023 for U.S. Appl. No. 17/324,345.

Final Office Action dated May 17, 2023 for U.S. Appl. No. 17/324,345.

Notice of Allowance dated Jul. 31, 2023 for U.S. Appl. No. 17/324,345.

* cited by examiner

IMAGE SENSOR WITH IMPROVED TIMING RESOLUTION AND PHOTON DETECTION PROBABILITY

REFERENCE TO RELATED APPLICATIONS

This Application is a Continuation of U.S. application Ser. No. 17/324,345, filed on May 19, 2021, which is a Divisional of U.S. application Ser. No. 16/408,859, filed on May 10, 2019 (now U.S. Pat. No. 11,018,168, issued on May 25, 2021), which claims the benefit of U.S. Provisional Application No. 62/733,970, filed on Sep. 20, 2018. The contents of the above-referenced Patent Applications are hereby incorporated by reference in their entirety.

BACKGROUND

Many modern day electronic devices (e.g., smartphones, digital cameras, biomedical imaging devices, automotive imaging devices, etc.) comprise image sensors. The image sensors comprise one or more photodetectors (e.g., photodiodes, phototransistors, photoresistors, etc.) configured to absorb incident radiation and output electrical signals corresponding to the incident radiation. Some types of image sensors include charge-coupled device (CCD) image sensors and complementary metal-oxide-semiconductor (CMOS) image sensors. Compared to CCD image sensors, CMOS image sensors are favored due to low power consumption, small size, fast data processing, a direct output of data, and low manufacturing cost. Some types of CMOS image sensors include front-side illuminated (FSI) image sensors and backside illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide-semiconductor (CMOS) image sensors comprise a single-photon avalanche diode (SPAD) disposed in a semiconductor substrate. The SPAD is a photodetector configured to absorb incident radiation (e.g., near-infrared radiation) and output electrical signals having a relatively large avalanche current compared to an amount of photo-generated charge carriers created in the photodetector (e.g., due to absorbing a photon). The SPAD comprises a pair of first wells having a first doping type (e.g., n-type doping) disposed in the semiconductor substrate. A second well having a second doping type (e.g., p-type doping) opposite the first doping type is disposed in the semiconductor substrate between the first wells. A doped buried layer is disposed in the semiconductor substrate below the second well and extends between the first wells. The second well contacts the doped buried layer in a vertical direction between the first wells. Thus, a p-n junction exists between the second well and the doped buried layer. Accordingly, a depletion region is formed (e.g., due to the p-n junction between the second well and the doped buried layer) along the second well and the doped buried layer.

One challenge with the CMOS image sensors is photon detection probability (PDP). For a CMOS image sensor comprising a near-infrared SPAD (NIR-SPAD), PDP is the probability that the NIR-SPAD will successful detect (e.g., output an electrical signal) a given input (e.g., about a single photon) propagating through space at near-infrared (NIR) wavelengths (e.g., between about 750 nanometers (nm) and about 2.5 micrometers (µm)). One possible solution to improve the PDP of the NIR-SPAD is to arrange the p-n junction between the second well and the doped buried region deeper in the semiconductor substrate (e.g., spaced further away from a surface of the semiconductor substrate) than in a shallow p-n junction NIR-SPAD (e.g., a NIR-SPAD having a p-n junction disposed near the surface of the semiconductor substrate).

Due to NIR radiation penetrating deeper into the semiconductor substrate and having a higher impact ionization rate (e.g., due to the wavelengths of NIR radiation), a p-n junction disposed deeper in the semiconductor substrate may improve the PDP of the NIR-SPAD due to the depletion region of the NIR-SPAD being arranged in a portion of the semiconductor substrate having a higher probability of photo-generated charge carriers transporting to the depletion region. Accordingly, the CMOS image sensor may have improved PDP. However, by arranging the p-n junction between the second well and the doped buried region deeper in the semiconductor substrate, timing resolution of the CMOS image sensor may be negatively affected.

For a CMOS image sensor comprising a NIR-SPAD, timing resolution is the statistical uncertainty that occurs when measuring the electrical signal output by the NIR-SPAD. For example, if timing resolution was zero, each electrical signal output by the NIR-SPAD would be output at an expected output signal time based on the time a photo-generated charge carrier is created in the NIR-SPAD. One factor that negatively affects timing resolution is that a photo-generated charge carrier may be created at varying locations in the semiconductor substrate between a top of the second well and the doped buried layer. The time it takes for the photo-generated charge carrier to transport from the varying locations to the depletion region is directly proportional to the distance in which the photo-generated charge carrier is created from the depletion region. Depending on where the photo-generated charge carrier is created (e.g., in the depletion region, near the depletion region, or relatively far from the depletion region), the NIR-SPAD may output an electrical signal that deviates (e.g., occurs before or after) from the expected output signal time. Accordingly, as the p-n junction is arranged deeper in the semiconductor substrate, performance of the CMOS image sensor may degrade due to timing resolution because of a maximum distance from the depletion region in which the NIR-SPAD may detect a given input signal (e.g., about a single photon) increasing.

In various embodiments, the present application is directed toward a CMOS image sensor having a second doped buried region having a first doping type disposed between a first doped buried region having the first doping type and a first well having a second doping type opposite the first doping type. The first well is disposed in a semiconductor substrate. The first doped buried region is disposed in the semiconductor substrate beneath the first well. The second doped buried region is disposed in the semiconductor substrate between the first well. The second doped buried region contacts the first well.

Because the second doped buried region contacts the first well and has an opposite doping type than the first well, a p-n junction exists between the second doped buried region and the first well. Thus, a depletion region is formed along the second doped buried region and the first well. Because the depletion region is disposed along the second doped buried region and the first well, the depletion region is more centrally disposed in the semiconductor substrate between the first doped buried layer and a top of the first well, yet may still be disposed deeper in the semiconductor substrate than in a CMOS image sensor having a shallow p-n junction NIR-SPAD. The CMOS image sensor of the present application may have improved PDP over the CMOS image sensor having the shallow p-n junction NIR-SPAD due to the depletion region being disposed deeper in the semiconductor substrate than in the CMOS image sensor having the shallow p-n junction NIR-SPAD. Further, varying locations in which a photo-generated charge carrier may be created may be more evenly spaced in/from the depletion region because the depletion region is more centrally disposed in the semiconductor substrate between the first doped buried layer and a top of the first well. Thus, the CMOS image sensor of the present application may have improved timing resolution due to the time it takes for the photo-generated charge carrier to transport from the varying locations to the depletion region being more uniform.

Figure 1:
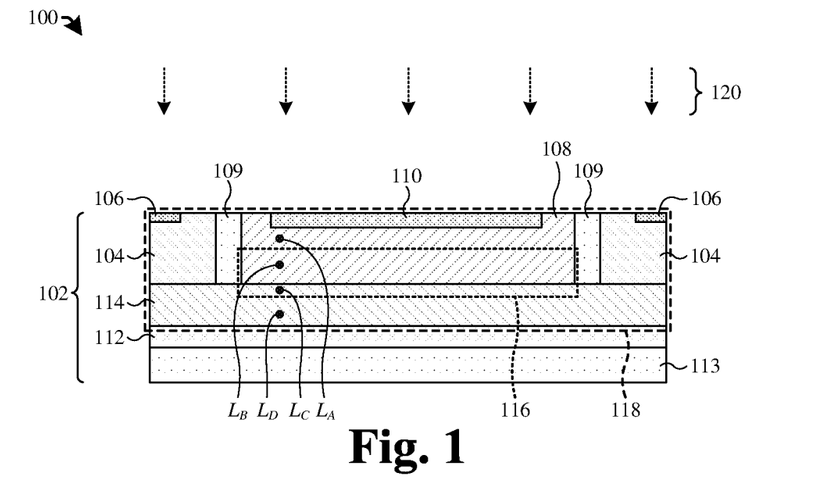
FIG. 1 illustrates a cross-sectional view of some embodiments of a complementary metal-oxide-semiconductor (CMOS) image sensor.

FIG. 1 illustrates a cross-sectional view of some embodiments of a complementary metal-oxide-semiconductor (CMOS) image sensor 100 having a second doped buried region having a first doping type disposed between a first doped buried region having the first doping type and a first well having a second doping type opposite the first doping type.

As shown in FIG. 1, the CMOS image sensor 100 comprises a semiconductor substrate 102. In some embodiments, the semiconductor substrate 102 may comprise any type of semiconductor body (e.g., monocrystalline silicon/CMOS bulk, silicon-germanium (SiGe), silicon on insulator (SOI), etc.).

A pair of first wells 104 are disposed in the semiconductor substrate 102. The first wells 104 are laterally spaced from one another and respectively extend into the semiconductor substrate 102 from a first side of the semiconductor substrate 102. In some embodiments, the first wells 104 are regions of the semiconductor substrate 102 comprising a first doping type (e.g., n-type doping). In some further embodiments, the first wells 104 may be a single well that is ring-shaped as viewed from above.

A pair of first electrodes 106 are disposed in the semiconductor substrate 102. The first electrodes 106 are disposed in the first wells 104, respectively. In some embodiments, the first electrodes 106 are regions of the semiconductor substrate 102 comprising the first doping type (e.g., n-type doping). In further embodiments, the first electrodes 106 have a higher concentration of the first doping type than the first wells 104. In yet further embodiments, the first electrodes 106 may be cathodes.

A second well 108 is disposed in the semiconductor substrate 102 between the first wells 104. In some embodiments, the second well 108 is a region of the semiconductor substrate 102 comprising a second doping type (e.g., p-type doping) opposite the first doping type. In further embodiments, the second well 108 extends into the semiconductor substrate from the first side of the semiconductor substrate 102. In yet further embodiments, the first wells 104 may be respectively spaced from the second well 108 on opposite sides of the second well 108. In such embodiments, lightly-doped regions 109 may respectively separate the first wells 104 from the second well 108. In some embodiments, the lightly-doped regions 109 are regions of the semiconductor substrate 102 comprising the second doping type (e.g., p-type doping). In further embodiments, the lightly-doped regions 109 have a lower concentration of the second doping type than the second well 108. In other embodiments, the lightly-doped regions 109 are intrinsic regions (e.g., undoped) of the semiconductor substrate 102.

A second electrode 110 is disposed in the second well 108. In some embodiments, the second electrode 110 is a region of the semiconductor substrate 102 comprising the second doping type (e.g., p-type doping). In further embodiments, the second electrode 110 has a higher concentration of the second doping type than the second well 108. In yet further embodiments, the second electrode 110 may be an anode.

A first doped buried region 112 is disposed in the semiconductor substrate 102 beneath the first wells 104 and the second well 108. In some embodiments, the first doped buried region 112 is a region of the semiconductor substrate 102 comprising the first doping type (e.g., n-type doping). In further embodiments, the first doped buried region 112 is vertically spaced from the first wells 104 and the second well 108. In yet further embodiments, the first doped buried region 112 laterally extends through the semiconductor substrate 102 beneath the first wells 104 and the second well 108.

In some embodiments, the first doped buried region 112 is disposed over a semiconductor region 113. In some embodiments, the semiconductor region 113 is a region of the semiconductor substrate 102 comprising the second doping type (e.g., p-type doping). In further embodiments, the semiconductor region 113 has a lower concentration of the second doping type than the second well 108. In yet further embodiments, the semiconductor region 113 has a substantially similar concentration of the second doping type as the lightly-doped regions 109. In other embodiments, the semiconductor region 113 is an intrinsic region (e.g., undoped) of the semiconductor substrate 102.

A second doped buried region 114 is disposed in the semiconductor substrate 102 between the first doped buried region 112 and the second well 108. In some embodiments, the second doped buried region 114 is a region of the semiconductor substrate 102 comprising the first doping type (e.g., n-type doping). In some embodiments, the second doped buried region 114 has a different concentration of the first doping type than the first doped buried region 112. In further embodiments, the second doped buried region 114 has a lower concentration of the first doping type than the first doped buried region 112. In yet further embodiments, the second doped buried region 114 laterally extends through the semiconductor substrate 102 over the first doped buried region 112 and beneath the first wells 104 and the second well 108.

In yet further embodiments, the second doped buried region 114 contacts the first doped buried region 112, the first wells 104, and the second well 108. Because the second doped buried region 114 has a different doping type than the second well 108 and contacts the second well 108, a p-n junction exists between the second doped buried region 114 and the second well 108. Thus, a depletion region 116 having a built-in electric field forms along the second well 108 and the second doped buried region 114.

In some embodiments, a photodetector 118 comprises the first wells 104, the second well 108, and the second doped buried region 114. The photodetector 118 is configured to absorb incident radiation 120 (e.g., photons) and to output electrical signals corresponding to the incident radiation. In some embodiments, the photodetector 118 is configured to absorb incident radiation 120 having near infrared (NIR) wavelengths (e.g., between about 750 nanometers (nm) and about 2.5 micrometers (μm)). In some embodiments, the photodetector 118 may be, for example, a photodiode, a phototransistor, a photoresistor, or the like. More specifically, in some embodiments, the photodetector 118 may be, for example, an avalanche photodiode (APD) or a single-photon avalanche photodiode (SPAD).

In some embodiments, during operation of the CMOS image sensor 100, an external reverse bias greater than an avalanche breakdown voltage of the photodetector 118 is applied to the photodetector 118 (e.g., by applying a positive voltage to the first electrode(s) 106 and a negative voltage to the second electrode 110). As the photodetector 118 absorbs incident radiation 120 (e.g., photons), photo-generated charge carriers may be formed at varying locations $L_A$-$L_D$ throughout the photodetector 118. In some embodiments, the varying locations $L_A$-$L_D$ comprise a first location $L_A$, a second location $L_B$, a third location $L_C$, and a fourth location $L_D$. In further embodiments, if a distance between a top of the first doped buried region 112 and a top surface of the semiconductor substrate 102 is x, the first location $L_A$ may be disposed about 0.01x to about 0.45x from the top surface of the semiconductor substrate 102, the second location $L_B$ may be disposed about 0.46x to about 0.57x from the top surface of the semiconductor substrate 102, the third location $L_C$ may be disposed about 0.58x to about 0.86x from the top surface of the semiconductor substrate 102, and the fourth location $L_D$ may be disposed about 0.87x to about 0.97x from the top surface of the semiconductor substrate 102. In yet further embodiments, the distance between a top of the first doped buried region 112 and a top surface of the semiconductor substrate 102 may be between about 2.5 μm and about 4.5 μm.

In some embodiments, due to the external reverse bias applied to the photodetector 118 being greater than the avalanche breakdown voltage, a single photo-generated charge carrier (e.g., due to the photodetector 118 absorbing a photon) may transport from one of the varying locations $L_A$-$L_D$ to the depletion region 116 causing the photodetector 118 to output an electrical signal having an avalanche current. In some embodiments, the photodetector 118 outputs the electrical signal having the avalanche current because of the built-in electric field of the depletion region 116 sweeping the photo-generated charge carrier away from the p-n junction between the second doped buried region 114 and the second well 108, such that a self-sustaining avalanche is triggered. In further embodiments, the photodetector 118 may output the electrical signal to a quenching circuit (not shown) (e.g., passive or active) configured to sense the electrical output and restore the photodetector 118 to its pre-electrical signal output operating condition.

Because the second doped buried region 114 is disposed between the second well 108 and the first doped buried region 112 and contacts the second well 108, the depletion region 116 (e.g., formed due to the p-n junction between the second well 108 and the second doped buried region 114) may be formed about mid-way between a bottom of the second electrode 110 and the top of the first doped buried region 112. Because the depletion region 116 forms about mid-way between the bottom of the second electrode 110 and the top of the first doped buried region 112, the first location $L_A$ and the fourth location $L_D$ are about evenly spaced from the depletion region 116. Thus, the time it takes for a photo-generated charge carrier to transport from the first location $L_A$ or the fourth location $L_D$ to the depletion region is about the same. Accordingly, timing resolution of the CMOS image sensor 100 may be improved. Further, because the depletion region is disposed along the second doped buried region 114 and the second well 108, the depletion region 116 may be disposed deeper in the semiconductor substrate 102 than in a CMOS image sensor having a shallow p-n junction NIR-SPAD (e.g., a NIR-SPAD having a p-n junction disposed near the surface of the semiconductor substrate). Accordingly, the CMOS image sensor 100 may have improved photo detection probability (PDP) over the CMOS image sensor having the shallow p-n junction NIR-SPAD due to the depletion region 116 being disposed deeper in the semiconductor substrate 102 than in the CMOS image sensor having the shallow p-n junction NIR-SPAD.

Figure 2:
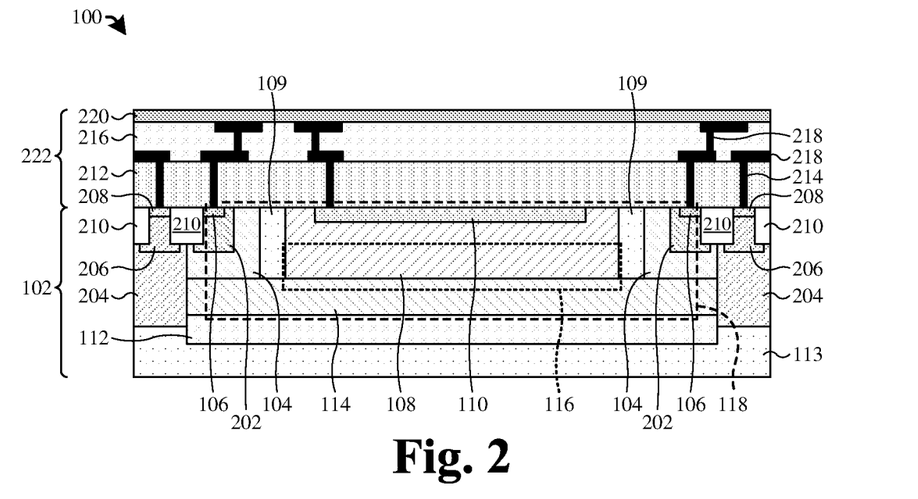
FIG. 2 illustrates a cross-sectional view of some more detailed embodiments of the CMOS image sensor of FIG. 1.

FIG. 2 illustrates a cross-sectional view of some more detailed embodiments of the CMOS image sensor of FIG. 1.

As shown in FIG. 2, the second well 108 is disposed in the semiconductor substrate 102 between the first wells 104. In some embodiments, opposite sides of the second well 108 may be laterally spaced by about 4 μm to about 18 μm. In some embodiments, the second doped buried region 114 is disposed between the first doped buried region 112 and the second well 108. In further embodiments, the first doped buried region 112 has a higher concentration of the first doping type than the second doped buried region 114. In yet further embodiments, the second doped buried region 114 has a higher concentration of the first doping type than the first wells 104.

A pair of third wells 202 are disposed in the semiconductor substrate 102. The third wells 202 are regions of the semiconductor substrate 102 having the first doping type (e.g., n-type doping). In some embodiments, the third wells 202 are disposed in the first wells 104, respectively. In some embodiments, the third wells 202 respectively separate the first electrodes 106 from the first wells 104. In some embodiments, the third wells 202 are respectively separated from the second doped buried region 114 by the first wells 104. In further embodiments, the third wells 202 have a higher concentration of the first doping type than the first wells 104. In yet further embodiments, the third wells 202 have a lower concentration of the first doping type than the first electrodes 106.

A pair of first pick-up wells 204 are disposed in the semiconductor substrate 102. The pick-up wells 204 are regions of the semiconductor substrate 102 having the second doping type (e.g., p-type doping). In some embodiments, the first pick-up wells 204 are configured to provide a bias to the semiconductor substrate 102. In further embodiments, the first wells 104 separate the first pick-up wells 204 from the second well 108, respectively. In further embodiments, the first pick-up wells 204 are each laterally spaced from the second well 108. In yet further embodiments, the lightly-doped regions 109 have a lower concentration of the second doping type than the first pick-up wells 204.

In some embodiments, bottoms of the first pick-up wells 204 may be disposed below bottoms of the first wells 104, respectively. In further embodiments, the bottoms of the first pick-up well 204 may be disposed between a bottom of the first doped buried region 112 and a top of the first doped buried region 112. In some embodiments, the first pick-up wells 204 may contact the first wells 104, respectively. In further embodiments, the first pick-up wells 204 may also contact the first doped buried region 112 and the second doped buried region 114. In such embodiments, sides of the first pick-up wells 204 facing the second well 108 may respectively contact the second doped buried region 114 and the first doped buried region 112 below the bottoms of the first wells 104 and respectively contact the first wells 104 above the bottoms of the first wells 104.

A pair of second pick-up wells 206 are disposed in the semiconductor substrate 102. The second pick-up wells 206 are regions of the semiconductor substrate 102 having the second doping type (e.g., p-type doping). In some embodiments, the second pick-up wells 206 are disposed in the first pick-up wells 204, respectively. In further embodiments, the second pick-up wells 206 have a higher concentration of the second doping type than the first pick-up wells 204. In yet further embodiments, the first pick-up wells 204 respectively separate the second pick-up wells 206 from the first wells 104.

A pair of pick-up well contacts 208 are disposed in the semiconductor substrate 102. The pick-up well contacts 208 are regions of the semiconductor substrate 102 having the second doping type (e.g., p-type doping). In some embodiments, the pick-up well contacts 208 are disposed in the second pick-up wells 206, respectively. In some embodiments, the second pick-up wells 206 may separate the pick-up well contacts 208 from the first pick-up wells 204, respectively. In further embodiments, the pick-up well contacts 208 may have a higher concentration of the second doping type than the second pick-up wells 206. In yet further embodiments, silicide structures (not shown) may be disposed on the pick-up well contacts 208.

A plurality of isolation structures 210 are disposed in the semiconductor substrate 102. The isolation structures 210 may, for example, be a shallow trench isolation (STI) structure, a deep trench isolation (DTI) structure, or the like. In some embodiments, some of the isolation structures 210 are disposed between the first electrodes 106 and the first pick-up well contacts 208, respectively. In some embodiments, portions of the first wells 104, the third wells 202, the first pick-up wells 204, the second pick-up wells 206, the first doped buried region 112, and/or the second doped buried region 114 may be directly disposed beneath the some of the isolation structures 210. In such embodiments, the first wells 104 may contact the first pick-up wells 204 beneath the some of the isolation structures 210. In further such embodiments, sides of the some of the isolation structures 210 may be laterally spaced from sides of the first wells 104 by about 0.2 μm to about 1.0 μm. In further such embodiments, the first doped buried region 112 and/or the second doped buried region 114 may contact the first pick-up wells 204 beneath the some of the isolation structures 210. In some embodiments, some other of the isolation structures 210 are respectively disposed on sides of the first pick-up well contacts 208 opposite the second well 108. In such embodiments, portions of the first pick-up wells 204 and/or the second pick-up wells 206 may be directly disposed beneath the some of the isolation structures 210.

An interlayer dielectric (ILD) layer 212 is disposed over the semiconductor substrate 102, the first wells 104, the second well 108, and the first pick-up wells 204. In some embodiments, the ILD layer 212 may have a substantially planar upper surface. In further embodiments, the ILD layer 212 comprises one or more of a low-k dielectric layer (e.g., a dielectric with a dielectric constant less than about 3.9), an ultra-low-k dielectric layer, an oxide (e.g., $SiO_2$), or the like. Further, a plurality of conductive contacts 214 are disposed in the ILD layer 212. In some embodiments, the conductive contacts 214 extend through the ILD layer 212 to respectively contact the first electrodes 106, the second electrode 110, and/or the pick-up well contacts 208.

An inter-metal dielectric (IMD) layer 216 is disposed on the ILD layer 212 and the conductive contacts 214. In some embodiments, the IMD layer 216 comprises one or more of a low-k dielectric layer, an ultra-low-k dielectric layer, an oxide, or the like. Further, a plurality of conductive features 218 (e.g., conductive lines and/or conductive vias) are disposed in the IMD layer 216. In some embodiments, multiple IMD layers 216 may be stacked on the ILD layer 212, and additional conductive features 218 may be disposed in each of the multiple IMD layers 216. In such embodiments, about 4 to about 10 IMD layers 216 may be stacked on the ILD layer 212 to reduce light attenuation caused by the multiple IMD layers 216 and the conductive features 218 respectively disposed in the multiple IMD layers 216.

A passivation layer 220 is disposed over the IMD layer 216 and the conductive features 218. In some embodiments, the passivation layer 220 may comprise, for example, an oxide, a nitride, an oxy-nitride, a polymer, or the like. In further embodiments, an interconnect structure 222 may comprise the ILD layer 212, the conductive contacts 214, the IMD layer 216, the conductive features 218, and the passivation layer 220. In yet further embodiments, the interconnect structure 222 is configured to provide electrical connections between various devices disposed throughout the CMOS image sensor 100.

Figure 3:
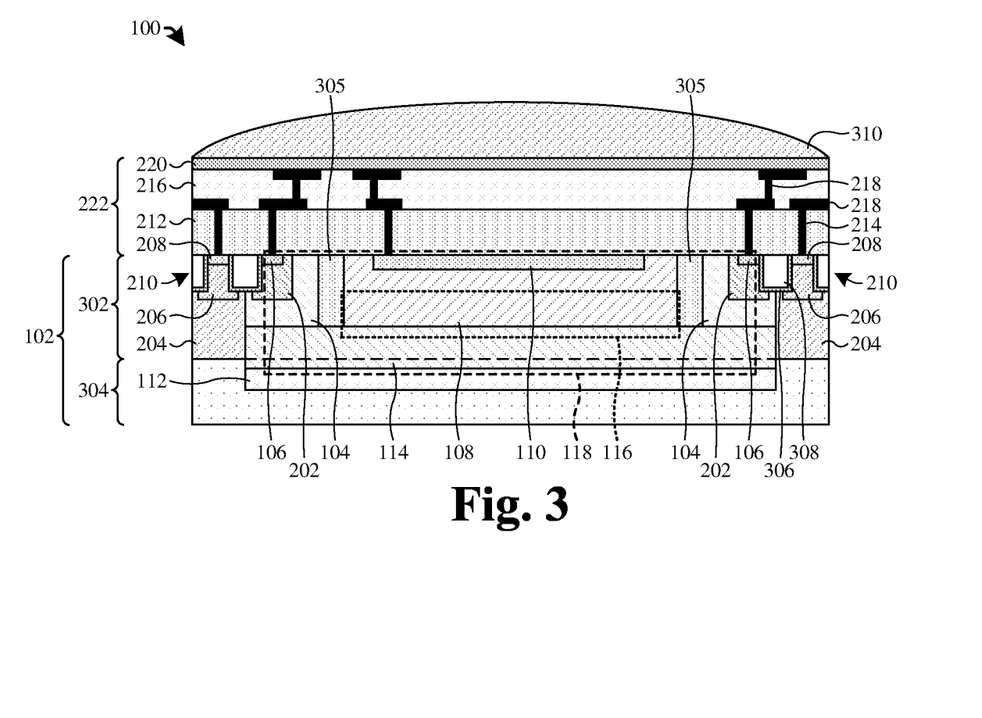
FIG. 3 illustrates a cross-sectional view of some alternative embodiments of the CMOS image sensor of FIG. 2.

FIG. 3 illustrates a cross-sectional view of some alternative embodiments of the CMOS image sensor of FIG. 2.

As shown in FIG. 3, the semiconductor substrate 102 comprises an epitaxial structure 302 disposed on a first semiconductor material layer 304. In some embodiments, the first semiconductor material layer 304 comprises a crystalline semiconductor material (e.g., monocrystalline silicon wafer, silicon, gallium-arsenide wafer, etc.). In some embodiments, the first semiconductor material layer 304 is intrinsic (e.g., undoped). In other embodiments, the first semiconductor material layer 304 may comprise the second doping type (e.g., p-type doping). In some embodiments, the epitaxial structure 302 comprises the second doping type. In some embodiments, epitaxial structure regions 305 separate the first wells 104 from the second well 108. In other embodiments, the epitaxial structure 302 may be intrinsic. In further embodiments, the epitaxial structure 302 may have a resistivity between about 6 ohm-centimeter and about 14 ohm-centimeter. In yet further embodiments, the epitaxial structure 302 may have a thickness between about 3 μm and about 7 μm.

In some embodiments, the second doped buried region 114 is disposed in both the epitaxial structure 302 and the first semiconductor material layer 304. In some embodiments, the first doped buried region 112 is disposed in the first semiconductor material layer 304. In further embodiments, the first wells 104, the third wells 202, the first electrodes 106, the first pick-up wells 204, the second pick-up wells 206, the pick-up well contacts 208, the isolation structures 210, the second well 108, and the second electrode 110 are disposed in the epitaxial structure 302. In yet further embodiments, a bottom of the second doped buried region 114 is disposed below the bottoms of the first pick-up wells 204.

In some embodiments, the isolation structures 210 respectively comprise isolation structure liners 306 and isolation structure dielectrics 308. The isolation structure dielectrics 308 are respectively disposed on the isolation structure liners 306. In some embodiments, the isolation structure liners 306 respectively separate the isolation structure dielectrics 308 from the epitaxial structure 302. In further embodiments, the isolation structure liners 306 may comprise, for example, a nitride, an oxide, an oxy-nitride, or the like. In yet further embodiments, the isolation structure dielectrics 308 may comprise an oxide (e.g., $SiO_2$).

In some embodiments, a micro-lens 310 is disposed on the passivation layer 220. The micro-lens is configured to focus incident radiation (e.g., photons) towards the photodetector 118. In other embodiments, the micro-lens 310 may be disposed on a back-side (e.g., on a side of the semiconductor substrate 102 opposite a side of the semiconductor substrate 102 in which the interconnect structure 222 is disposed) of the semiconductor substrate 102.

FIGS. 4-15 illustrate a series of cross-sectional views of some embodiments of a method for forming the CMOS image sensor of FIG. 3.

Figure 4:
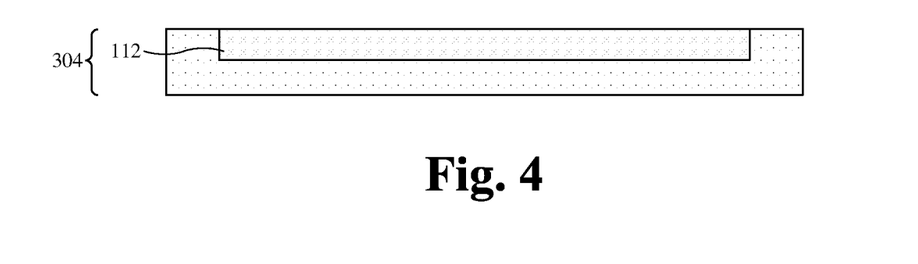
FIGS. 4-15 illustrate a series of cross-sectional views of some embodiments of a method for forming the CMOS image sensor of FIG. 3.

As shown in FIG. 4, a first doped buried region 112 is formed in a first semiconductor material layer 304. The first doped buried region 112 is a region of the first semiconductor material layer 304 comprising a first doping type (e.g., n-type doping). In some embodiments, the first doped buried region 112 may be formed by a first selective ion implantation process that utilizes a masking layer (not shown) to selectively implant ions into the first semiconductor material layer 304.

In some embodiments, the first selective ion implantation utilized to form the first doped buried region 112 may comprise implanting a dosage of antimony ions between about $5.0 \times 10^{14}$ ions/cm$^2$ and about $5.0 \times 10^{15}$ ions/cm$^2$ into the first semiconductor material layer 304 at an ion energy between about 50 kiloelectron volts (keV) and about 150 keV. In some embodiments, the first selective ion implantation utilized to form the first doped buried region 112 may also comprise implanting a dosage of phosphorous ions between about $1.0 \times 10^{13}$ ions/cm$^2$ and about $1.0 \times 10^{15}$ ions/cm$^2$ into the first semiconductor material layer 304 at an ion energy between about 30 keV and about 100 keV. In further embodiments, a first drive-in anneal (e.g., rapid thermal anneal (RTA), furnace anneal, etc.) may be performed on the first semiconductor material layer 304 to activate the ions implanted by the first selective ion implantation. In yet further embodiments, the first drive-in anneal may comprise heating the first semiconductor material layer 304 in a nitrogen gas ($N_2$) environment to a temperature between about 900° C. and about 1200° C. for about 30 minutes to about 130 minutes.

Figure 5:
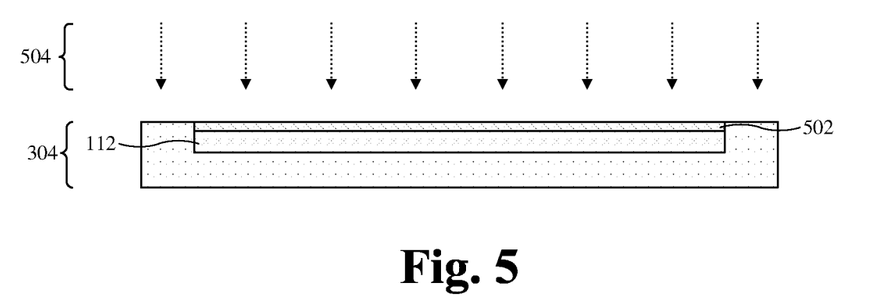

As shown in FIG. 5, an initial doped layer 502 is formed in the first semiconductor material layer 304 and over the first doped buried region 112. The initial doped layer 502 is a region of the first semiconductor material layer 304 comprising the first doping type (e.g., n-type doping). In some embodiments, the initial doped layer 502 is formed with a lower concentration of the first doping type than the first doped buried region 112. In some embodiments, the initial doped layer 502 may be formed by a second selective ion implantation process 504 that utilizes a masking layer (not shown) to selectively implant ions into the first doped buried region 112. In further embodiments, the second selective ion implantation process 504 may comprise implanting a dosage of phosphorous ions between about $5.0 \times 10^{13}$ ions/cm$^2$ and about $1.0 \times 10^{15}$ ions/cm$^2$ into the first doped buried region 112 at an ion energy between about 20 keV and about 100 keV.

Figure 6:
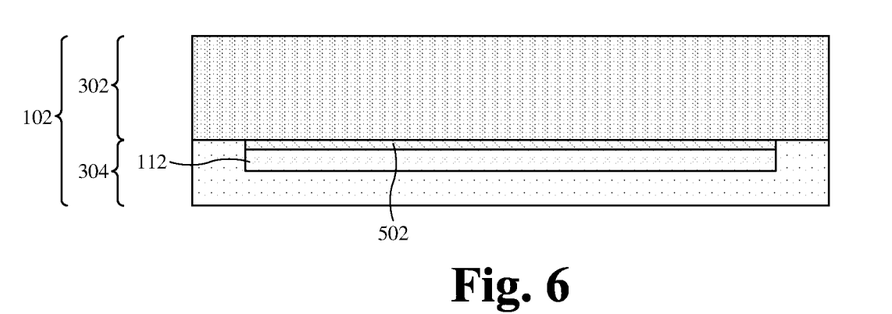

As shown in FIG. 6, an epitaxial structure 302 is formed on the first semiconductor material layer 304 and the initial doped layer 502. In some embodiments, the epitaxial structure 302 may formed with a resistivity between about 6 ohm-centimeter and about 14 ohm-centimeter. In some embodiments, the epitaxial structure 302 may have a thickness between about 3 μm and about 7 μm. In further embodiments, the epitaxial structure 302 may be formed by, for example, vapor-phase epitaxy (VPE), molecular-beam epitaxy (MBE), liquid-phase epitaxy (LPE), solid-phase epitaxy (SPE), reduced pressure chemical vapor deposition (RP-CVD) epitaxy, metalorganic vapor phase epitaxy (MOVPE), or the like. In yet further embodiments, a planarization process (e.g., a chemical-mechanical planarization (CMP)) may be performed on an upper surface of the epitaxial structure 302 to form a planar upper surface. In some embodiments, a semiconductor substrate 102 comprises the epitaxial structure 302 and the first semiconductor material layer 304

Figure 7:
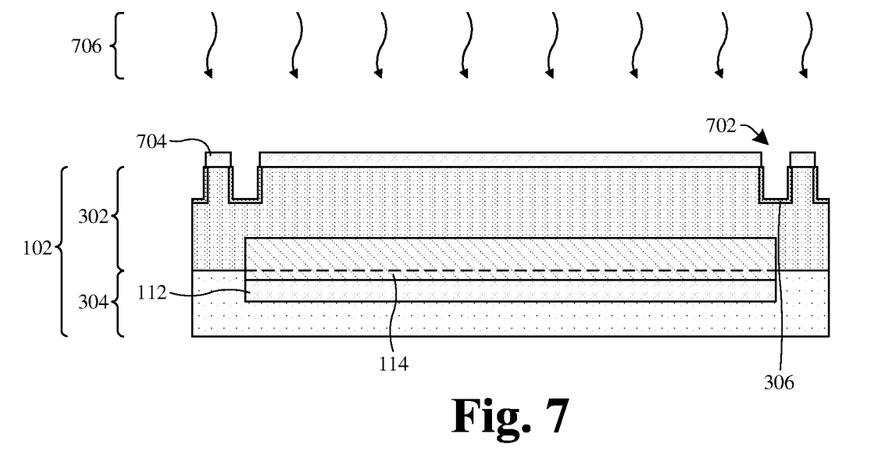

As shown in FIG. 7, a plurality of trenches 702 are formed in the epitaxial structure 302. In some embodiments, the trenches 702 are laterally spaced and respectively extend into the epitaxial structure 302 from a first side of the epitaxial structure 302. In some embodiments, some of the trenches 702 at least partially overlap the first doped buried region 112 in a vertical direction.

In some embodiments, a process for forming the trenches 702 comprises performing an etch (e.g., a dry etch and/or a wet etch) into the epitaxial structure 302. In some embodiments, the etch may be performed with an isolation structure patterning stack 704 formed on the epitaxial structure 302. In some embodiments, the isolation structure patterning stack 704 may comprise a nitride layer disposed over the epitaxial structure 302 and a masking layer disposed on the nitride layer. The epitaxial structure 302 is then exposed to one or more etchant(s) that remove portions of the nitride layer of the isolation structure patterning stack 704 and the epitaxial structure 302 not covered by the masking layer to form the trenches 702. Subsequently, the masking layer of the isolation structure patterning stack 704 may be removed. In yet further embodiments, one or more deposition process(es) (e.g., chemical vapor deposition (CVD), physical vapor deposition (PVD), atomic layer deposition (ALD), thermal oxidation, sputtering, etc.) may be utilized to form the isolation structure patterning stack on the epitaxial structure 302.

Also shown in FIG. 7, isolation structure liners 306 are respectively formed lining the trenches 702. The isolation structure liners 306 may comprise, for example, a nitride, an oxide, an oxy-nitride, or the like. In some embodiment, the isolation structure liners 306 may be deposited and/or grown on the epitaxial structure 302 by, for example, thermal oxidation, CVD, PVD, ALD, sputtering, or the like. In some embodiments, after the isolation structure liners 306 are respectively formed in the trenches 702, an isolation structure liner anneal 706 (RTA, furnace anneal, etc.) may be performed on the semiconductor substrate 102 to reduce defects at an interface between the isolation structure liners 306 and the epitaxial structure 302. In further embodiments, the isolation structure liner anneal 706 may comprise heating the semiconductor substrate 102 to a temperature between about 900° C. and about 1200° C. for about 200 minutes to about 300 minutes. In yet further embodiments, the isolation structure liner anneal 706 also diffuses ions of the initial doped layer 502 into the epitaxial structure 302 to form the second doped buried region 114.

Figure 8:
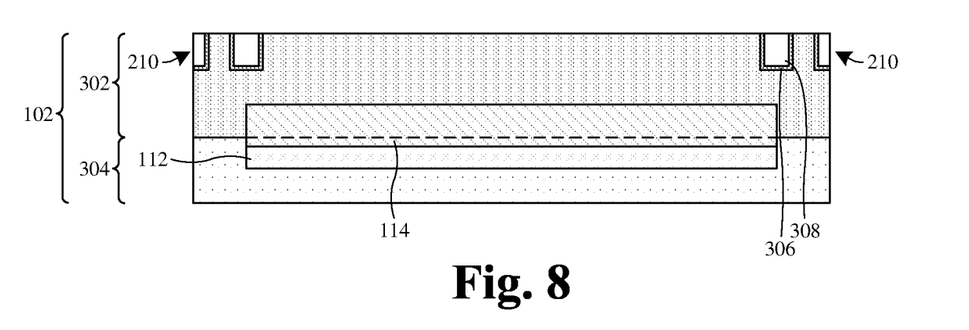

As shown in FIG. 8, isolation structure dielectrics 308 are respectively formed in the trenches 702 and on the isolation structure liners 306 to form a plurality of isolation structures 210 in the epitaxial structure 302. In some embodiments, the isolation structure dielectrics 308 may comprise an oxide (e.g., $SiO_2$). In further embodiments, the isolation structure dielectrics 308 have upper surfaces that are coplanar with upper surfaces of the isolation structure liners 306 and the upper surface of the epitaxial structure 302.

In some embodiments, a process for forming the isolation structure dielectrics 308 comprises depositing and/or growing (e.g., by CVD, PVD, ALD, thermal oxidation, sputtering, etc.) an isolation structure dielectric layer (not shown) on the isolation structure liners 306 and the nitride layer of the isolation structure patterning stack 704, such that the isolation structure dielectric layer fills the trenches 702. Subsequently, a planarization process (e.g., CMP) is performed on the isolation structure dielectric layer to remove excess portions of the isolation structure dielectric layer. In some embodiments, the planarization process may expose the nitride layer of the of the isolation structure patterning stack 704. After the planarization process, the nitride layer of the isolation structure patterning stack 704 may be stripped away.

Figure 9:
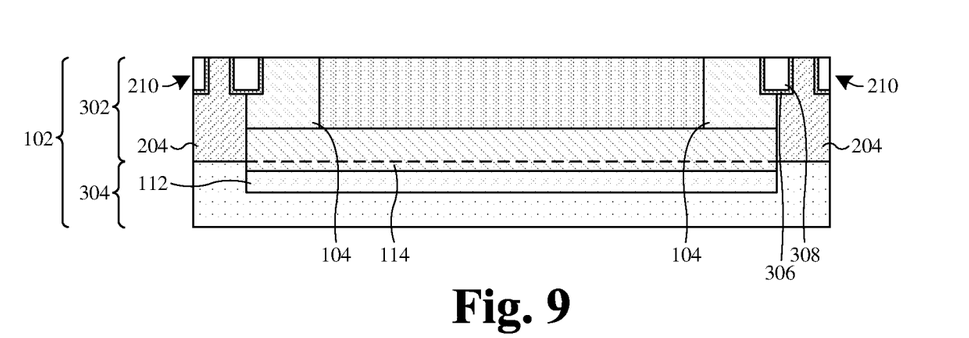

As shown in FIG. 9, a pair of first wells 104 are formed in the epitaxial structure 302. The first wells 104 are regions of the epitaxial structure 302 comprising the first doping type (e.g., n-type doping). In some embodiments, the first wells 104 are formed with a lower concentration of the first doping type than the second doped buried region 114. In some embodiments, the first wells 104 may be formed by a third selective ion implantation process that utilizes a masking layer (not shown) to selectively implant ions into the epitaxial structure 302. In further embodiments, the third ion implantation process may comprise implanting a dosage of phosphorous ions between about $1.0 \times 10^{12}$ ions/cm$^2$ and about $8.0 \times 10^{12}$ ions/cm$^2$ into the epitaxial structure 302 at an ion energy between about 2200 keV and about 2800 keV.

Also shown in FIG. 9, a pair of first pick-up wells 204 are formed in the epitaxial structure 302. The pick-up wells 204 are regions of the epitaxial structure 302 comprising the second doping type (e.g., p-type doping). In some embodiments, the pick-up wells 204 respectively contact the second doped buried region 114 and the first wells 104. In some embodiments, the pick-up wells 204 may be formed by a fourth selective ion implantation process that utilizes a masking layer (not shown) to selectively implant ions into the epitaxial structure 302. In further embodiments, the fourth ion implantation process may comprise implanting a dosage of boron ions between about $1.0 \times 10^{12}$ ions/cm$^2$ and about $5.0 \times 10^{12}$ ions/cm$^2$ into the epitaxial structure 302 at an ion energy between about 400 keV and about 800 keV.

Figure 10:
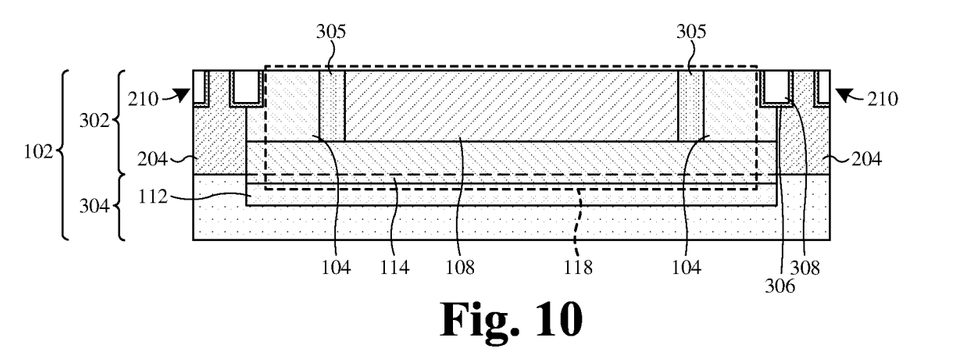

As shown in FIG. 10, a second well 108 is formed in the epitaxial structure 302 between the first wells 104. The second well 108 is a region of the epitaxial structure 302 comprising the second doping type (e.g., p-type doping). In some embodiments, the second well 108 may be formed with a higher concentration of the second doping type than the first pick-up wells 204. In further embodiments, the second well 108 may be formed laterally spaced from the first wells 104. In yet further embodiments, a photodetector 118 comprises the first wells 104, the second well 108, and the second doped buried region 114.

In some embodiments, the second well 108 may be formed by a fifth selective ion implantation process that utilizes a masking layer (not shown) to selectively implant ions into the epitaxial structure 302. In further embodiments, the fifth ion implantation process may comprise implanting a dosage of boron ions between about $1.0 \times 10^{13}$ ions/cm$^2$ and about $1.0 \times 10^{14}$ ions/cm$^2$ into the epitaxial structure 302 at an ion energy between about 1000 keV and about 2000 keV. In further embodiments, a second drive-in anneal (e.g., RTA, furnace anneal, etc.) may be performed on the semiconductor substrate 102 to activate the ions implanted by the third, fourth, and/or fifth selective ion implantation process(es). In yet further embodiments, the second drive-in anneal may comprise heating the first semiconductor material layer 304 in a $N_2$ environment to a temperature between about 800° C. and about 1200° C. for about 30 minutes to about 120 minutes.

Figure 11:
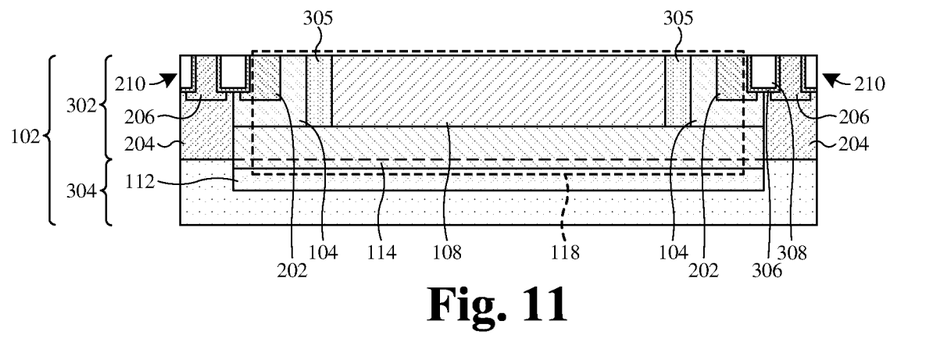

As shown in FIG. 11, a pair of third wells 202 are formed in the epitaxial structure 302. The third wells 202 are regions of the epitaxial structure 302 comprising the first doping type (e.g., n-type doping). In some embodiments, the third wells 202 are respectively formed in the first wells 104. In some embodiments, the third wells 202 are formed with a higher concentration of the first doping type than the first wells 104. In further embodiments, third wells 202 may be formed by a sixth selective ion implantation process that utilizes a masking layer (not shown) to selectively implant ions into the epitaxial structure 302.

Also shown in FIG. 11, a pair of second pick-up wells 206 are formed in the epitaxial structure 302. The second pick-up wells 206 are regions of the epitaxial structure 302 comprising the second doping type (e.g., p-type doping). In some embodiments, the second pick-up wells 206 are respectively formed in the first pick-up wells 204. In some embodiments, the second pick-up wells 206 are formed with a higher concentration of the second doping type than the first pick-up wells 204. In further embodiments, the second pick-up wells 206 may be formed by a seventh selective ion implantation process that utilizes a masking layer (not shown) to selectively implant ions into the epitaxial structure 302.

Figure 12:
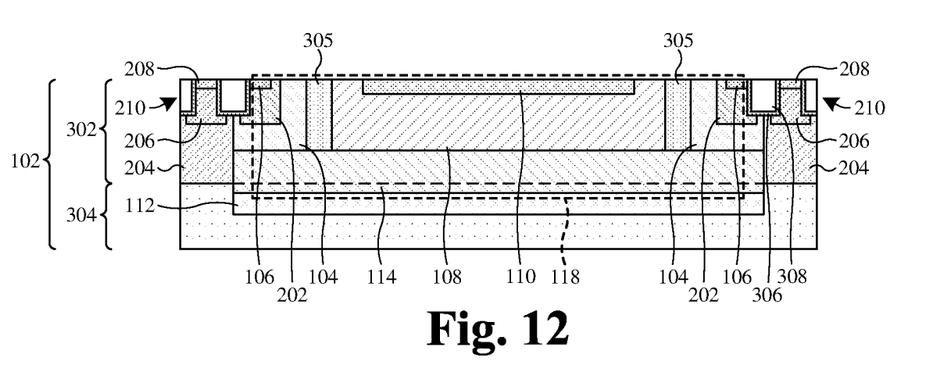

As shown in FIG. 12, a pair of first electrodes 106 are formed in the epitaxial structure 302. The first electrodes 106 are regions of the epitaxial structure 302 comprising the first doping type (e.g., n-type doping). In some embodiments, the first electrodes 106 are respectively formed in the third wells 202. In further embodiments, the first electrodes 106 may be formed with a higher concentration of the first doping type than the third wells 202. In yet further embodiments, the first electrodes 106 may be formed by an eighth selective ion implantation process that utilizes a masking layer (not shown) to selectively implant ions into the epitaxial structure 302.

Also shown in FIG. 12, a second electrode 110 and a pair of pick-up well contacts 208 are formed in the epitaxial structure 302. The second electrode and the pick-up well contacts 208 are regions of the epitaxial structure 302 comprising the second doping type (e.g., p-type doping). In some embodiments, the second electrode 110 may be formed with a higher concentration of the second doping type than the second well 108. In some embodiments, the pick-up well contacts 208 may be formed with a higher concentration of the second doping type than the second pick-up wells 206. In further embodiments, the second electrode 110 and the pick-up well contacts 208 may be formed by a ninth selective ion implantation process that utilizes a masking layer (not shown) to selectively implant ions into the epitaxial structure 302. In other embodiments, the second electrode 110 and the pick-up well contacts 208 may be formed by individual ion implantation process(es) that utilize individual masking layers (not shown). In yet further embodiments, silicide structures (not shown) (e.g., nickel silicide, titanium silicide, cobalt silicide, etc.) may be formed on the first electrodes 106, the second electrode 110, and/or the pick-up well contacts 208 by a suitable silicide process (e.g., a salicide process).

Figure 13:
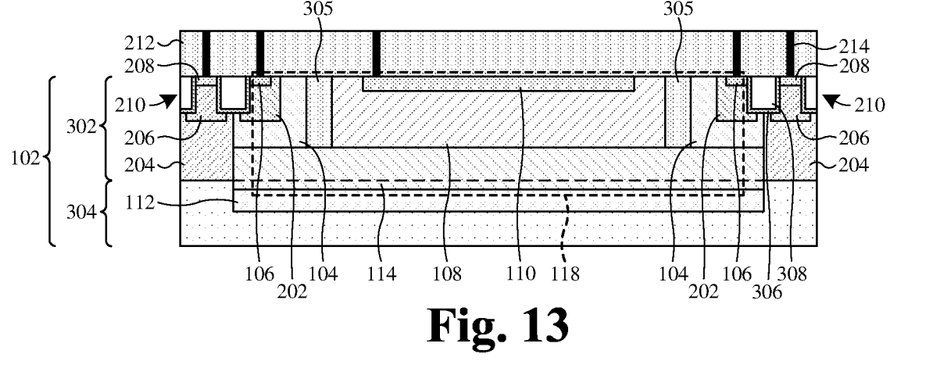

As shown in FIG. 13, an interlayer dielectric (ILD) layer 212 is formed on the epitaxial structure 302. In some embodiments, the ILD layer 212 comprises one or more layers of a low-k dielectric layer, an ultra-low-k dielectric layer, an oxide, or the like. In further embodiments, the ILD layer 212 may be deposited by, for example, CVD, PVD, ALD, sputtering, or the like. In yet further embodiments, a planarization process (e.g., CMP) may be performed on the ILD layer 212 to form a substantially planar upper surface.

Also shown in FIG. 13, conductive contacts 214 are formed in the ILD layer 212. In some embodiments, a process for forming the conductive contacts 214 comprises performing a first etch into the ILD layer 212 to form contact openings that correspond to the conductive contacts 214. In some embodiments, the etch may be performed with a masking layer (not shown) formed over the ILD layer 212. In further embodiments, the process comprises filling the contact openings with a conductive material (e.g., tungsten). In yet further embodiments, the contact openings may be filled by depositing or growing (e.g., by CVD, PVD, ALD, sputtering, electrochemical plating, electroless plating, etc.) a conductive layer covering the ILD layer 212 that fills the contact openings, and subsequently performing a planarization process (e.g., CMP) on the ILD layer 212. In various embodiments, the process may be part of a single damascene like process or a dual damascene like process.

Figure 14:
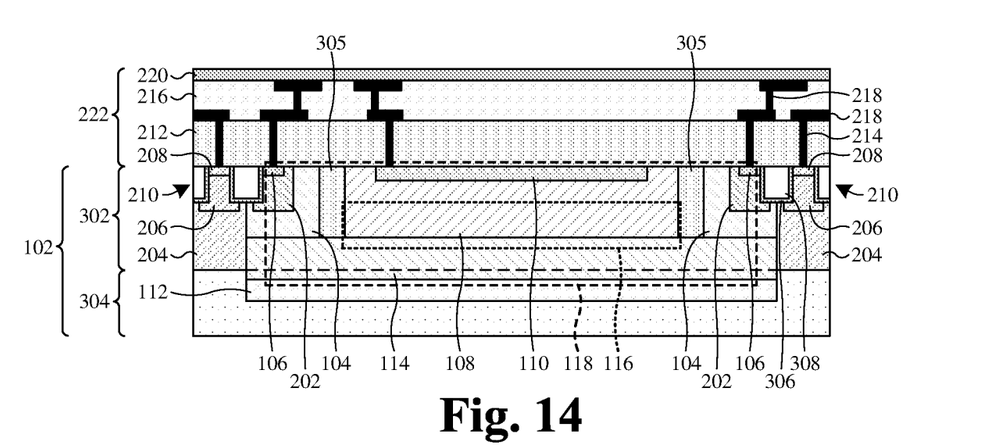

As shown in FIG. 14, an inter-metal dielectric (IMD) layer 216 is formed on the ILD layer 212. In some embodiments, the IMD layer 216 comprises, for example, a low-k dielectric layer, an ultra-low-k dielectric layer, or an oxide. In some embodiments, the IMD layer 216 may be deposited or grown on the ILD layer 212 by, for example, CVD, PVD, ALD, sputtering, or the like. In further embodiments, a planarization process (e.g., CMP) may be performed on the IMD layer 216 to form a substantially planar upper surface.

A plurality of conductive features 218 (e.g., conductive lines and conductive vias) are formed in the IMD layer 216. In some embodiments, a process for forming the conductive features 218 comprises performing an etch into the IMD layer 216 to form conductive feature openings. In some embodiments, the etch may be performed with a masking layer (not shown) formed over the IMD layer 216. In some embodiments, the process comprises filling the conductive feature openings with a conductive material (e.g., copper, aluminum, etc.). In further embodiments, the conductive feature openings may be filled by depositing or growing (e.g., by CVD, PVD, ALD, sputtering, electrochemical plating, electroless plating, etc.) a conductive layer covering the IMD layer 216 that fills the conductive feature openings, and subsequently performing a planarization (e.g., CMP) on the IMD layer 216. In yet further embodiments, multiple IMD layers 216 each having a plurality of conductive features 218 disposed in the IMD layers 216 may be formed stacked on the ILD layer 212. In such embodiments, about 4 to about 10 IMD layers 216 may be stacked on the ILD layer 212 to reduce light attenuation caused by multiple IMD layers 216 and the respective conductive features 218 disposed in the IMD layers 216.

Also shown in FIG. 14, a passivation layer 220 is formed on the IMD layer 216 and some of the conductive features 218. In some embodiments, the passivation layer 220 may comprise, for example, an oxide, a nitride, an oxy-nitride, a polymer, or the like. In further embodiment, the passivation layer 220 may be formed by CVD, PVD, ALD, sputtering, a spin on process, or the like. In yet further embodiments, an interconnect structure 222 comprises the ILD layer 212, the conductive contacts 214, the IMD layer 216, the conductive features 218, and the passivation layer 220.

Figure 15:
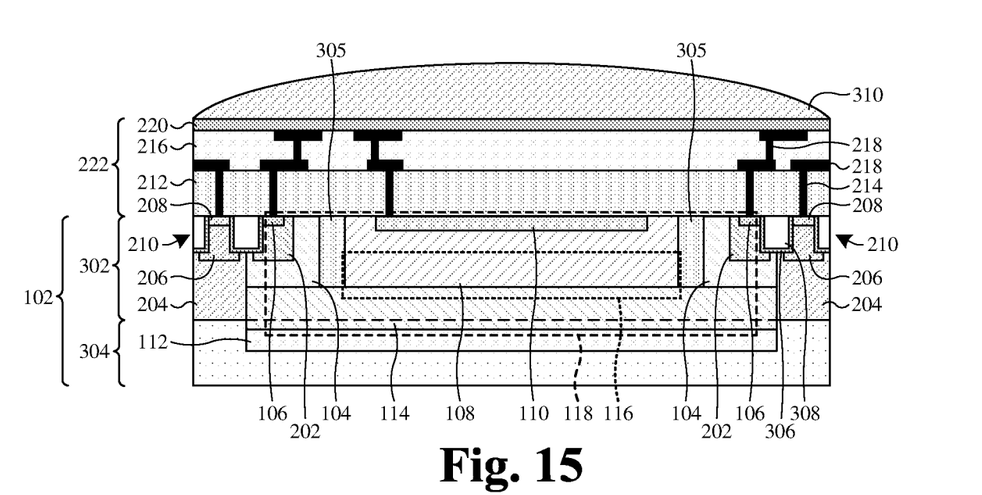

As shown in FIG. 15, a micro-lens 310 is formed on the passivation layer 220. In some embodiments, the micro-lens 310 may be formed by depositing (e.g., by a spin-on method or a deposition process) a micro-lens material on the passivation layer 220, A micro-lens template (not shown) having a curved upper surface is patterned on the micro-lens material. In further embodiments, the micro-lens template may comprise a photoresist material exposed using a distributing exposing light dose (e.g., for a negative photoresist, more light is exposed at a bottom of the curvature and less light is exposed at a top of the curvature), developed and baked to form a rounding shape. In further embodiments, the micro-lens 310 is then formed by selectively etching the micro-lens material according to the micro-lens template. In yet further embodiments, the micros-lens 310 may be formed on a back-side of the semiconductor substrate 102 (e.g., on a side of the semiconductor substrate 102 opposite a side of the semiconductor substrate 102 in which the interconnect structure 222 is disposed).

Figure 16:
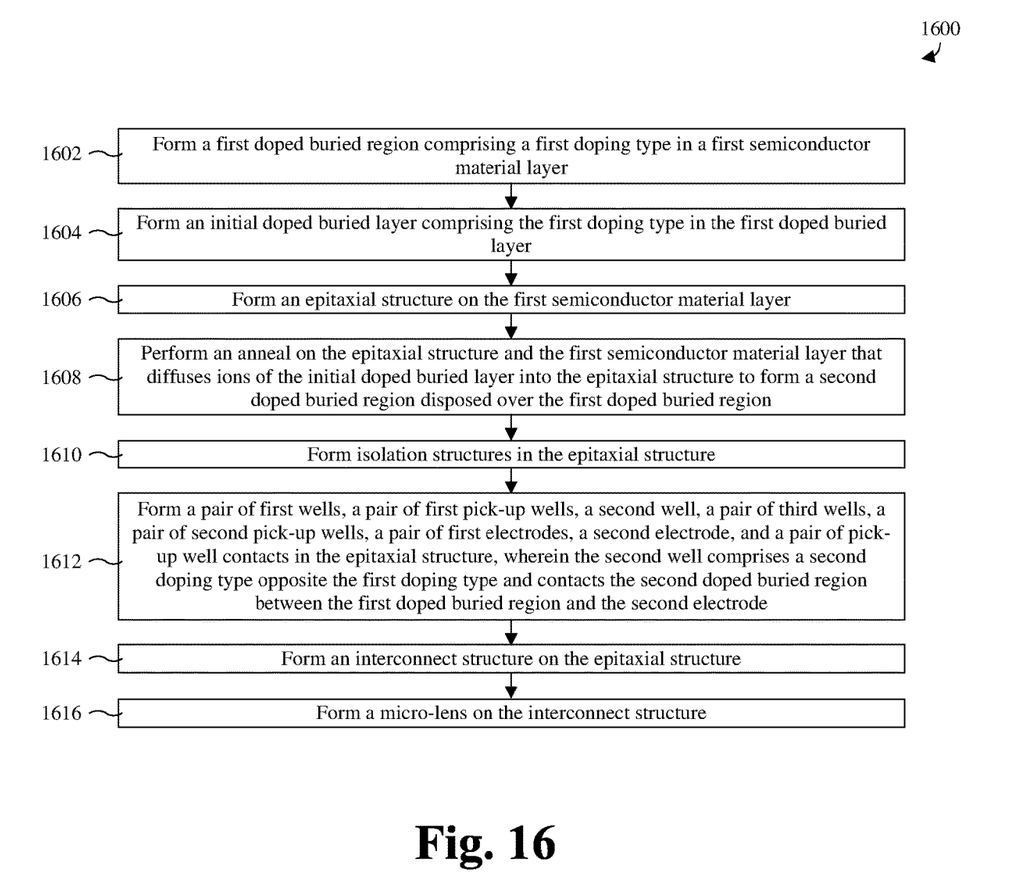
FIG. 16 illustrates a flowchart of some embodiments of a method for forming the CMOS image sensor of FIG. 3.

As illustrated in FIG. 16, a flowchart 1600 of some embodiments of a method for forming the CMOS image sensor of FIG. 3 is provided. While the flowchart 1600 of FIG. 16 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1602, a first doped buried region comprising a first doping type is formed in a first semiconductor material layer. FIG. 4 illustrates a cross-sectional view of some embodiments corresponding to act 1602.

At 1604, an initial doped buried layer comprising the first doping type is formed in the first doped buried layer. FIG. 5 illustrates a cross-sectional view of some embodiments corresponding to act 1604.

At 1606, an epitaxial structure is formed on the first semiconductor material layer. FIG. 6 illustrates a cross-sectional view of some embodiments corresponding to act 1606.

At 1608, an anneal is performed on the epitaxial structure and the first semiconductor material layer that diffuses ions of the initial doped buried layer into the epitaxial structure to form a second doped buried region disposed over the first doped buried region. FIG. 7 illustrates a cross-sectional view of some embodiments corresponding to act 1608.

At 1610, isolation structures are formed in the epitaxial structure. FIGS. 7-8 illustrate a series of cross-sectional views of some embodiments corresponding to act 1610.

At 1612, a pair of first wells, a pair of first pick-up wells, a second well, a pair of third wells, a pair of second pick-up wells, a pair of first electrodes, a second electrode, and a pair of pick-up well contacts are formed in the epitaxial structure, wherein the second well comprises a second doping type opposite the first doping type and contacts the second doped buried region between the first doped buried region and the second electrode. FIGS. 9-12 illustrate a series of cross-sectional views of some embodiments corresponding to act 1612.

At 1614, an interconnect structure is formed on the epitaxial structure. FIGS. 13-14 illustrate a series of cross-sectional views of some embodiments corresponding to act 1614.

At 1616, a micro-lens is formed on the epitaxial structure. FIG. 15 illustrates a cross-sectional view of some embodiments corresponding to act 1616.

In some embodiments, the present application provides a photodetector. The photodetector includes a first well having a first doping type disposed in a semiconductor substrate, where the first well extends into the semiconductor substrate from a first side of the semiconductor substrate. A second well having a second doping type opposite the first doping type is disposed in the semiconductor substrate on a side of the first well, where the second well extends into the semiconductor substrate from the first side of the semiconductor substrate. A first doped buried region having the second doping type is disposed in the semiconductor substrate, where the first doped buried region extends laterally through the semiconductor substrate beneath the first well and the second well. A second doped buried region having the second doping type is disposed in the semiconductor substrate and vertically between the first doped buried region and the first well. The second doped buried region contacts the first well, such that a photodetector p-n junction exists along the second doped buried region and the first well.

In other embodiments, the present application provides a method for forming a photodetector. The method includes forming a first doped buried region having a first doping type in a semiconductor substrate. A second doped buried region having the first doping type is formed in the first doped buried region and over the first doped buried region, where the second doped buried region is formed with a different concentration of the first doping type than the first doped buried region. A pair of first wells having the first doping type are formed in the semiconductor substrate, where the first wells are laterally spaced from one another. A second well having a second doping type opposite the first doping type is formed in the semiconductor substrate and over the second doped buried region, where the second well is formed between the first wells, and where a bottom of the second well contacts a top of the second doped buried region such that a photodetector p-n junction exits along the bottom of the second well and the top of the second doped buried region. A pair of first electrodes having the first doping type are formed in the semiconductor substrate, where the first electrodes are respectively formed in the first wells. A second electrode having the second doping type is formed in the second well.

In yet other embodiments, the present application provides a photodetector. The photodetector includes a pair of first wells having a first doping type disposed in an epitaxial structure. The first wells are laterally spaced from one another. The epitaxial structure is disposed on a first semiconductor substrate. A second well having a second doping type opposite the first doping type is disposed in the epitaxial structure between the first wells. A pair of cathodes are disposed in the epitaxial structure, where the cathodes are respectively disposed in the first wells. An anode is disposed in the second well. A first doped buried region having the first doping type is disposed in the first semiconductor material layer, where the first doped buried region extends laterally through the first semiconductor material layer beneath the pair of cathodes and the anode. A second doped buried region having the first doping type is disposed in the epitaxial structure and the first semiconductor material layer between the first doped buried region and the second well, where the second doped buried region has a lower concentration of the first doping type than the first doped buried region. The second doped buried region contacts the second well, such that a photodetector p-n junction exists along the second doped buried region and the second well.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photodetector, comprising:
 a first well extending into a semiconductor substrate from a top of the semiconductor substrate and having a first doping type;

a first doped buried layer in the semiconductor substrate; and a second doped buried layer in the semiconductor substrate between and directly contacting the first doped buried layer and the first well, wherein the first and second doped buried layers have a second doping type opposite the first doping type and further have different dopant types, wherein the second doped buried layer and the first well directly contact each other at a PN junction, wherein the first and second doped buried layers have individual top boundaries underlying the first well, wherein the semiconductor substrate comprises a first semiconductor layer and a second semiconductor layer overlying and directly contacting the first semiconductor layer, wherein a first interface at which the first and second doped buried layers directly contact each other is vertically offset relative to a second interface at which the first and second semiconductor layers directly contact each other, and wherein the first or second doped buried layer straddles the second interface.

2. The photodetector according to claim 1, wherein the first doping type is P type, and wherein the second doping type is N type.

3. The photodetector according to claim 1, wherein the first and second doped buried layers are entirely recessed relative to the first well.

4. The photodetector according to claim 1, wherein the first and second doped buried layers have substantially the same widths.

5. The photodetector according to claim 1, further comprising:
a second well extending into the semiconductor substrate from the top of the semiconductor substrate, wherein the second well has the second doping type and further has a pair of well segments between which the first well is arranged, and wherein the well segments extend respectively to opposite ends of the second doped buried layer.

6. The photodetector according to claim 1, wherein the first interface is recessed relative to the second interface, and wherein a top of the second doped buried layer is elevated relative to the second interface.

7. A photodetector, comprising:
a first well extending into a semiconductor substrate from a top of the semiconductor substrate and having a first doping type;
a first doped buried layer and a second doped buried layer that are buried in the semiconductor substrate and that have a second doping type opposite the first doping type, wherein the second doped buried layer has a top boundary underlying and directly contacting the first well at a PN junction, and further has a bottom boundary overlying and directly contacting the first doped buried layer at a first interface; and
a second well having the second doping type in the semiconductor substrate and further having a pair of well segments, which are respectively on opposite sides of the first well and which have individual sidewall boundaries facing away from the first well and separated by a separation less than a width of the semiconductor substrate and about equal to individual widths of the first and second doped buried layers, and wherein doping concentration linearly along a combined height of the first and second doped buried layers has a jump at the first interface.

8. The photodetector according to claim 7, wherein the jump occurs linearly along the combined height from the second doped buried layer to the first doped buried layer.

9. The photodetector according to claim 7, wherein the second doped buried layer has a lesser doping concentration than the first doped buried layer.

10. The photodetector according to claim 7, wherein the first and second doped buried layers have individual topmost locations that are closer to an elevation at a bottom boundary of the first well than to an elevation at the top of the semiconductor substrate.

11. The photodetector according to claim 7,
wherein the first and second doped buried layers have individual topmost locations that are closer to an elevation at a bottom boundary of the second well than to an elevation at the top of the semiconductor substrate.

12. The photodetector according to claim 7, wherein the semiconductor substrate comprises a first semiconductor layer and a second semiconductor layer overlying and directly contacting the first semiconductor layer, wherein the second doped buried layer straddles a second interface at which the first and second semiconductor layers directly contact each other, and wherein the first interface is recessed relative to the second interface.

13. A photodetector, comprising:
a first well extending into a semiconductor substrate from a top of the semiconductor substrate and having a first doping type;
a second well extending into the semiconductor substrate from the top of the semiconductor substrate, wherein the second well is laterally separated from the first well and has a second doping type opposite the first doping type;
a first doped layer buried in the semiconductor substrate and having the second doping type;
a second doped layer buried in the semiconductor substrate, vertically between the first doped layer and the first well, wherein the second doped layer has the second doping type and directly contacts the first well at a PN junction; and
a pick-up well extending into the semiconductor substrate from the top of the semiconductor substrate and having the first doping type, wherein the pick-up well has a side facing the first well and directly contacting the second doped layer, and the second well, and the first doped layer.

14. The photodetector according to claim 13, wherein the side of the pick-up well has a smooth cross-sectional profile from top to bottom.

15. The photodetector according to claim 13, wherein the second well comprises a pair of well segments between which the first well is arranged, and wherein the well segments extend respectively to opposite ends of the second doped layer.

16. The photodetector according to claim 15, wherein the well segments have individual sidewall boundaries facing away from the first well respectively on opposite sides of the first well, and wherein a separation between the individual sidewall boundaries is about a same as individual widths of the first and second doped layers.

17. The photodetector according to claim 13, wherein the first and second doped layers and the second well have individual sidewall boundaries arranged edge to edge to form a common sidewall facing away from the first well towards the side of the pick-up well.

18. The photodetector according to claim 13, further comprising:

a semiconductor region extending into the semiconductor substrate from the top of the semiconductor substrate, wherein the semiconductor region has the first doping type and further has a different doping profile than the first well laterally along an axis extending parallel to a top surface of the semiconductor substrate, and wherein the semiconductor region laterally separates the second well from the first well and further overlies the first and second doped layers.

19. The photodetector according to claim 7, wherein the individual sidewall boundaries of the pair of well segments have a first sidewall boundary, and wherein the first sidewall boundary and individual sidewall boundaries of the first and second doped buried layers are edge to edge to form a common sidewall facing away from the first well.

20. The photodetector according to claim 7, further comprising:
    a pick-up well extending into the semiconductor substrate from the top of the semiconductor substrate and having the first doping type, wherein the pick-up well has a side facing the first and second wells.

\* \* \* \* \*